United States Patent
Baeumel et al.

(10) Patent No.: US 6,198,183 B1
(45) Date of Patent: *Mar. 6, 2001

(54) INTEGRATED ELECTRIC DRIVE UNIT INCLUDING AN ELECTRIC MOTOR AND AN ELECTRONIC CONTROL AND MONITORING MODULE

(75) Inventors: Hermann Baeumel, Neumarkt; Hermann Kilian, Diespeck; Bernhard Schuch, Neusitz; Otmar Bitsche, Stuttgart, all of (DE)

(73) Assignee: DaimlerChrysler AG (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/294,655

(22) Filed: Apr. 19, 1999

(30) Foreign Application Priority Data

Apr. 18, 1998 (DE) .............................................. 198 17 333

(51) Int. Cl.[7] .............................. H02K 9/00; H02K 1/32; H02K 5/00

(52) U.S. Cl. ................................ 310/52; 310/54; 310/64; 310/89

(58) Field of Search .................................. 310/52, 54, 57, 310/64, 89, 11, 16, 227; 165/47, 56, 104.11, 104.33, 185; 105/59; 336/55, 57, 58

(56) References Cited

U.S. PATENT DOCUMENTS

| | | | |
|---|---|---|---|
| 2,683,823 | * 7/1954 | Cunningham et al. | 310/57 |
| 2,734,459 | * 2/1956 | Zimsky | 310/54 |
| 3,833,826 | * 9/1974 | Barton et al. | 310/52 |
| 4,447,947 | * 5/1984 | McCarty | 29/825 |
| 4,531,357 | * 7/1985 | Weber et al. | 60/39.07 |
| 4,739,204 | * 4/1988 | Kitamura et al. | 310/68 D |
| 4,818,906 | * 4/1989 | Kitamura et al. | 310/58 |
| 4,870,307 | * 9/1989 | Kitamura et al. | 310/54 |
| 4,931,678 | * 6/1990 | Lutz | 310/62 |
| 4,961,017 | * 10/1990 | Kakinoki et al. | 310/71 |
| 4,980,588 | * 12/1990 | Ogawa | 310/68 D |
| 5,058,660 | * 10/1991 | Hedstrom | 165/47 |
| 5,331,238 | * 7/1994 | Johnsen | 310/58 |
| 5,491,370 | * 2/1996 | Schneider et al. | 310/54 |
| 5,585,681 | * 12/1996 | Bitsche | 310/54 |
| 5,664,916 | * 9/1997 | Link et al. | 409/135 |
| 5,678,646 | 10/1997 | Fliege | 180/65.1 |
| 5,763,969 | * 6/1998 | Metheny et al. | 310/62 |

FOREIGN PATENT DOCUMENTS

| | | |
|---|---|---|
| 4311518 | 10/1994 | (DE) . |
| 4442867 | 6/1996 | (DE) . |
| 19626213 | 1/1998 | (DE) . |
| 19635196 | 3/1998 | (DE) . |

* cited by examiner

*Primary Examiner*—Thomas M. Dougherty
*Assistant Examiner*—Dang Dinh Le
(74) *Attorney, Agent, or Firm*—W. F. Fasse; W. G. Fasse

(57) ABSTRACT

An electric drive unit includes an electronic control and monitoring module integrally connected to an electric motor. The housing of the electric motor has a double-walled construction to form a water jacket with cooling water passages therein. The electronic module includes at least one high power component that requires cooling. This component is mounted directly on a cooling insert that extends through a recess in the electronic module housing and is inserted in an opening provided in the outer wall of the motor housing. In this manner, the cooling insert is integrated into the water jacket of the motor housing and is directly cooled by the cooling water flowing in the cooling passages. A very compact and reliable construction is achieved, in which the electric motor and the electronic module share a common water cooling circuit. External water hoses and external electrical connections between the electric motor and the electronic module are avoided.

22 Claims, 2 Drawing Sheets

INTEGRATED ELECTRIC DRIVE UNIT INCLUDING AN ELECTRIC MOTOR AND AN ELECTRONIC CONTROL AND MONITORING MODULE

PRIORITY CLAIM

This application is based on and claims the priority under 35 U.S.C. §119 of German Patent Application 198 17 333.4, filed on Apr. 18, 1998, the entire disclosure of which is incorporated herein by reference.

FIELD OF THE INVENTION

The invention relates to an electric drive unit that includes an electric motor as well as an electronic module for controlling and monitoring the operation of the motor.

BACKGROUND INFORMATION

Electric drive units are coming into use in a great variety of applications. For example among motor vehicles, the use of low-emission vehicles that derive at least a portion of their main drive energy and/or energy for auxiliary drives from electrical sources, is ever increasing. Typical electric drive units comprise an electric motor for providing the electrical drive power, and an electronic module for controlling and monitoring the operation of the electric motor, for example for regulating the rotational speed and output power of the electric motor.

Such electric motors, due to their high power density, must be cooled during operation and therefore are typically equipped with a cooling circuit, which is usually a water cooling circuit that uses flowing water as a cooling medium. One way of providing the water flow passages necessary for the cooling circuit, is to provide the electric motor with a double-walled housing that forms a water jacket which allows the cooling water to flow through passages arranged between the outer wall and the inner wall of the motor housing.

An electronic module for controlling and monitoring the electric motor generally includes a plurality of different functional units, such as a power unit and a control unit, for example. The electronic module is arranged as a separate and independent module that is located spaced away from or separate from the electric motor. Generally, at least one of the functional units included in the electronic module (e.g. the power unit) has a high power dissipation and must therefore be correspondingly cooled. In order to provide the necessary cooling, i.e. to carry away the dissipated heat, the electronic module conventionally includes its own separate cooling circuit that is connected in series with the cooling circuit of the electric motor by means of coupling hoses or the like. Additionally, external signal conductors and power supply cables are connected between the electronic module and the electric motor for conducting sensor signals and control signals as well as the power supply voltage between the motor and the electronic module. These external connection lines are typically embodied as cables having connector plugs connected to corresponding sockets provided on the electronic module housing and on the electric motor housing.

Several disadvantages arise from such a structural arrangement of the conventional electric drive unit with the electronic module separated from the electric motor, and especially with separate cooling circuits and external cable connections for the electric motor and for the electronic module. First, the necessary connections between the electric motor and the electronic module for achieving the overall cooling, the signal transfer, and the power transfer to realize the complete electric drive unit become complicated and give rise to problems with regard to reliability, durability, aging, wear and tear, and seal leakage problems in the coupling hoses and cables between the electric motor and the electronic module. Secondly, the surface area required for mounting the components and therewith also the total structural volume of the electric drive unit is increased. Thirdly, the assembly of the electric drive unit is rather complicated and leads to relatively high manufacturing costs.

SUMMARY OF THE INVENTION

In view of the above, it is an object of the invention to provide an electric drive unit in which an electric motor and an electronic module are more effectively and more simply integrated together, than was the case in the prior art. It is also an object of the invention to provide an electric drive unit that has a simple construction, a low cost, a high reliability, and a simplified manufacturing thereof. The invention further aims to avoid or overcome the disadvantages of the prior art, while achieving all of the prior art advantages as well as additional advantages, as apparent from the present specification.

The above objects have been achieved in an integrated electric drive unit according to the invention, comprising an electric motor and an electronic module The electric motor includes a rotor and a stator or any other known motor components arranged within a double-walled housing, wherein cooling passages forming a cooling circuit are provided between the inner wall and the outer wall of the motor housing. A cooling medium can flow through the cooling passages forming the cooling circuit. The electronic module comprises at least one functional unit that dissipates heat energy and thus requires cooling, and an electronic module housing in which the functional unit is arranged. The outer wall of the electric motor housing has an opening which provides access into the cooling passages of the cooling circuit between the outer and inner walls of the motor housing. The electronic module housing has an opening or recess at least generally corresponding to the dimensions and shape of the opening in the motor housing.

The functional unit of the electronic module that requires cooling is mounted on a cooling insert, especially in the form of a cylindrically curved cooling plate. The cooling insert is received in the recess of the electronic module housing, and is arranged in the opening of the outer wall of the electric motor housing, so that it is in direct contact with the cooling medium flowing in the cooling circuit between the inner and outer walls of the motor housing. Especially, the cooling insert protrudes into the opening in the motor housing in such a manner that the cooling insert contacts or rests against the inner wall of the motor housing.

According to the invention, the electric motor and the electronic module are combined with one another to form an integrated electric drive unit. The cooling system for the electric motor and the electronic module is combined and realized for both components in common, by using a single cooling circuit to cool both components together. Since the power dissipating functional unit of the electronic module is mounted on the cooling insert, the dissipated heat is conducted into the cooling insert. Then, since the electronic module is assembled and mounted on the electric motor so that the cooling insert protrudes into the water jacket of the motor housing, the dissipated heat is carried away from the cooling insert by the cooling medium flowing through the cooling circuit. The cooling insert may especially be arranged to contact flushly against the inner wall of the motor housing. Thereby, the cooling insert is completely integrated into the water jacket or cooling circuit, so that the electric motor and the electronic module are cooled simultaneously.

With the above integrated arrangement according to the invention, it is not necessary to provide coupling hoses or pipes between the electric motor and the electronic module to achieve the required cooling of these two components of the electric drive unit. Thus, any problems such as installation complexity and sealing difficulties associated with the use of external water conduits, e.g. hoses or pipes, for externally connecting the motor and the electronic module, are avoided.

According to a further detail of the invention, a thermal insulation layer is preferably arranged between the cooling insert and the inner wall of the motor housing. Since the inner wall of the motor housing is generally hotter than the outer wall, the heat being conducted by the inner wall could otherwise negatively influence the cooling of the electronic module via the cooling insert and as a result also impact the functionality of the electronic module, in the absence of such a thermal insulating layer. The thermal insulating layer for example comprises a high temperature resistant synthetic plastic film that is applied onto the bottom surface of the cooling insert which faces the inner wall of the motor housing. For example, a polyimide film or a polytetrafluoroethylene (e.g. Teflon) film that is provided with an adhesive backing on one side thereof can be adhered onto the bottom surface of the cooling insert before the insert is installed in the opening of the motor housing. In this manner, a temperature resistance of up to 180° C. can be achieved.

The shape of the cooling insert is matched to the shape of the electric motor and the electronic module, or more particularly to the shape of the motor housing and the electronic module housing. The overall size of the cooling insert is selected dependent on the amount of dissipated power that must be rejected through the cooling insert. In other words, the required cooling capacity must be provided by the cooling insert arranged in the cooling circuit of the water jacket. The bottom surface or side of the cooling insert that faces toward the inner wall of the motor housing can be provided with geometrical elements or protrusions, for example in the form of diamond-shaped, rhombic, pyramid-frustum, or lenticular-shaped protrusions, in order to increase the surface area of the cooling insert exposed to the flow of cooling medium, and to form flow channels for directing the flow of cooling medium. The cooling insert preferably consists of a material having a high thermal conductivity, for example copper, aluminum, copper and/or aluminum alloys, AlSiC or AlN, and may be formed by any known process such as die casting, stamping, forging, molding, pressing, etc., by ingot or powder metallurgy methods.

A mechanical connection between the electric motor and the electronic module is provided by means of suitable fastening elements, for example by means of straps or bails that are fastened and tightened by means of bolts or the like. This arrangement presses a seal element between the electronic module and the motor housing so as to form a water-tight seal for the cooling insert relative to the opening in the outer wall of the motor housing.

The electrical connection between the electric motor and the electronic module is achieved by means of internal connections, for example provided by internal connection lines arranged within the overall or common housing of the electric drive unit. For example, the electrical interconnection can be achieved through aligned openings provided in the motor housing and in the electronic module housing, by means of suitable connector plugs and sockets arranged in these aligned openings, or by connection cables extending through such aligned openings. The necessary openings can be provided, for example, in the area of the bearing plate or bearing member at an end of the electric motor or through a cylindrical sidewall of the motor housing adjoining the electronic module. In this manner, it is not necessary to provide external plug and socket connections as well as external connector cables between the motor and the electronic module.

The electronic module comprises a plurality of functional units respectively arranged on circuit boards or the like, which are layered or stacked one above another in several circuit planes, which are integrated into an overall compact construction. For example, the plural functional units may include: a power unit including power semiconductor components for generating the properly timed phase current for the electric motor arranged in a first circuit plane; a connection or junction unit including conductor paths and contact pads for providing the necessary contacting, phase busing or distribution, and d.c. power supply distribution on a high current circuit board arranged in a second circuit plane above the power unit; and a control unit for controlling and monitoring the power semiconductor components of the power unit arranged in a third circuit plane above the connection or junction unit. Electrical connectors made of copper or copper alloys, for example, and having compensation corrugations or bends for mechanically decoupling the various circuit planes from each other, are arranged between the circuit boards or carrier substrates of the several circuit planes. In other words, such compensating connectors are arranged between the carrier substrate of the power unit and the carrier substrate of the connection or junction unit (i.e. the high current circuit board), and between the carrier substrate of the control unit and the carrier substrate of the connection or junction unit (i.e. the high current circuit board).

The inventive integration of the electric motor and the electronic module into a compact electric drive unit, while simultaneously providing a common cooling function for both components advantageously achieves a small structural installation volume of the overall electric drive unit. This further achieves good electrical characteristics by omitting the external connection cables and the like and instead using substantially shorter internal connection lines. Moreover, the inventive arrangement achieves a high reliability and durability, as well as a reduced cost in manufacturing and maintaining the electric drive unit.

BRIEF DESCRIPTION OF THE DRAWINGS

In order that the invention may be clearly understood, it will now be described in connection with an example embodiment, with reference to the accompanying drawings, wherein.

DETAILED DESCRIPTION OF PREFERRED EXAMPLE EMBODIMENTS AND OF THE BEST MODE OF THE INVENTION

Figure 1:
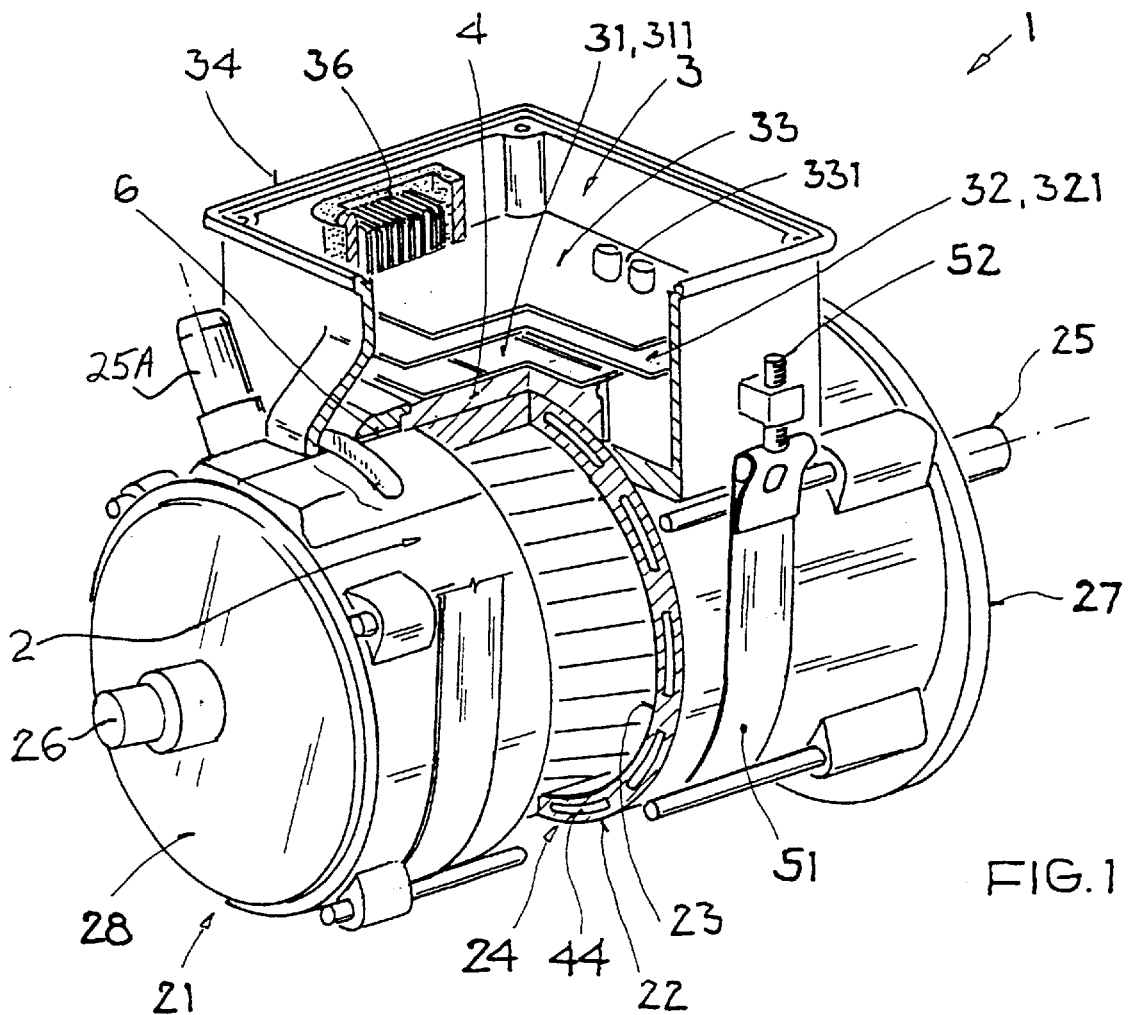
FIG. 1 is a three-dimensional perspective view of an embodiment of an electric drive unit according to the invention.
Figure 2:
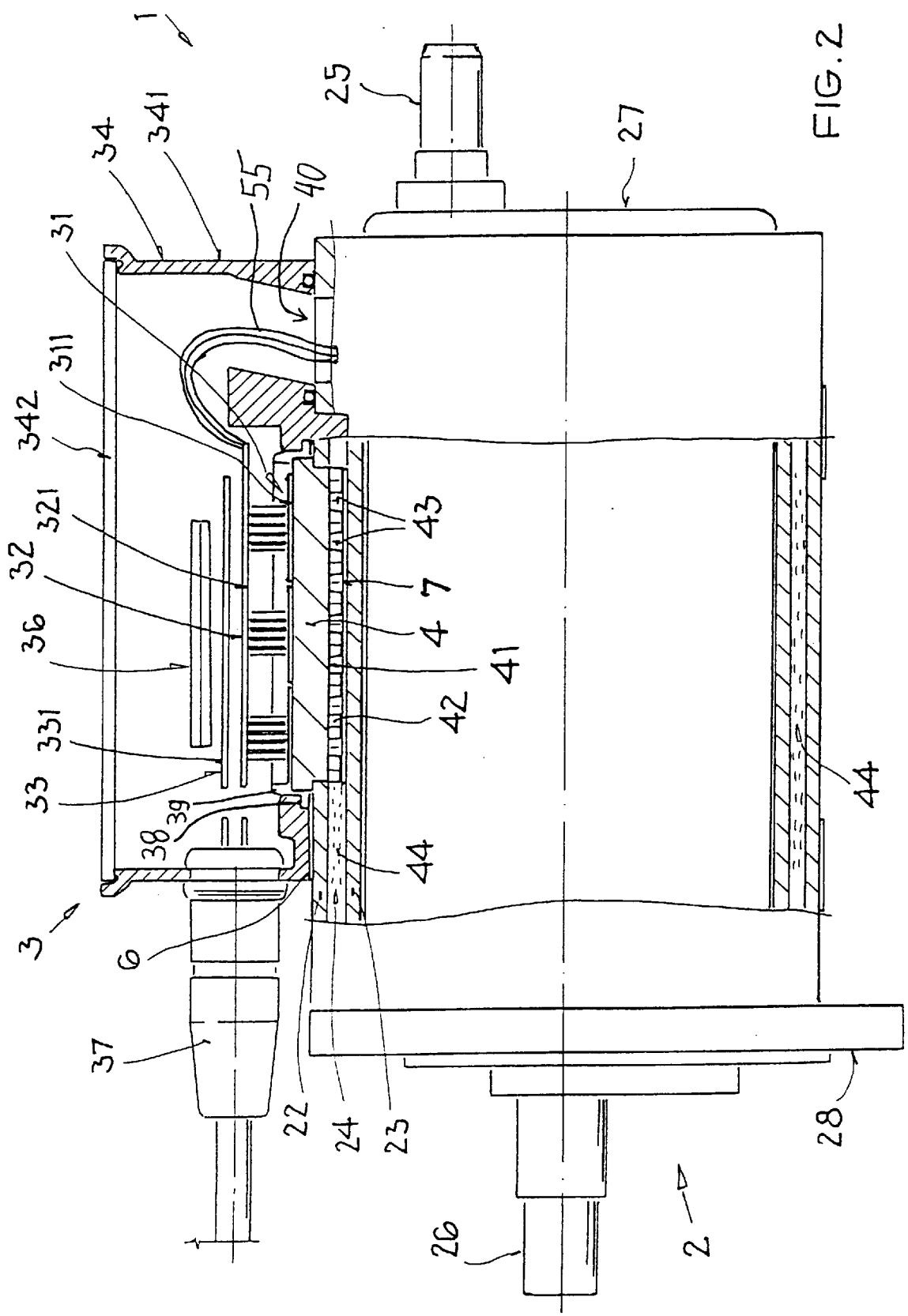
FIG. 2 is a partially broken open sectional view of an electric drive unit according to the invention, whereby the internal workings of the electric motor have not been shown in detail.

Referring to FIGS. 1 and 2, the electric drive unit 1 of the present embodiment of the invention comprises an electric motor 2 and an electronic module 3, and is suitable for providing the auxiliary mechanical drive power for a motor vehicle, by converting electrical to mechanical power. The input electrical power may be provided by a fuel cell, for example. The electric motor 2 is, for example, a water cooled reluctance motor and particularly a shift reluctance motor (SR-motor) with a nominal rated power output of 8 kW. The internal workings of the electric motor 2 are not shown in detail, for the sake of simplicity and clarity, but can include any known components such as a stator and a rotor. The electric motor 2 includes a motor housing 21 enclosing the inner workings of the motor. The motor housing 21 is a double-walled housing including a cylindrical circumferential inner wall 23 and an outer wall 22, with cooling passages forming a water jacket 24 through which a cooling medium such as cooling water 44 can circulate, between the inner wall 23 and the outer wall 22.

The electric motor 2 has a substantially cylindrical shape with two end faces or plates 27 and 28 connected to opposite ends of the inner and outer walls 23 and 22. A pipe stub 25 and a shaft stub 26 respectively extend from the end faces 27 and 28. The shaft stub 26 extending from the end face 28 is connected to the rotor within the motor 2 and is adapted to be externally coupled to the working shaft, e.g. the drive shaft of the drive system in which it is installed. The pipe stub 25 extending from the end face 27 is embodied as an inlet and an outlet for the cooling water 44, and is therefore connected for flow communication with the flow passages of the water jacket 24. This pipe stub 25 may be externally coupled to a heat exchanger or "radiator" or the overall cooling system of the vehicle. As an alternative to the pipe stub 25 extending from the end face 27, a pipe stub 25A can be arranged to extend substantially radially from the cylindrical outer wall of the electric motor housing.

The electronic module 3 of the electric drive unit 1 includes the following components arranged in an electronic module housing 34. A power unit 31 includes electrical or electronic components mounted on a carrier or substrate 311 that is suitable for high current flows and for a sufficient dissipation or rejection of the dissipated power, and that is arranged in a first circuit plane of the electronic module 3 within the module housing 34. For example, power semiconductor components of the power unit 31 are arranged on a direct copper bonding (DCB) substrate 311 comprising a ceramic carrier arranged between two copper layers. The required current carrying capacity of the power unit 31 is achieved, for example, by connecting three DCB substrates 311 in parallel with each other. As an example, one of the DCB substrates 311 has dimensions of 35 mm×49 mm, the two copper layers respectively have a thickness of 300 $\mu$m, and the ceramic carrier arranged therebetween is made of AlN and has a thickness of 0.635 mm. The DCB substrates 311 are directly mounted on a cooling insert 4 and are connected thereto, for example by soldering. The cooling insert 4 is made of a material having a high thermal conductivity and acts as a heat sink and heat dissipator the power unit 31. The cooling insert 4 will be described in detail below.

The electronic module 3 further comprises a connection or junction unit 32 arranged on a high current circuit board 321 forming a second circuit plane above the power unit 31. This connection or junction unit 32 provides d.c. voltage distribution or busing, phase distribution or busing of the motor phases for the electric motor 2, control lines or connections for the control unit 33 described below, and contacts for the components of the power unit 31, the control unit 33 and further components of the electronic module 3. As an example, the high current circuit board 321 may consist of an FR4 material having a basic surface area of 100 mm×100 mm, and an exemplary total thickness of 2.5 mm with a four-layered construction of four individual layers. In the conductor path structure realized with four conductor path planes in a four-layered construction of the high current circuit board 321, the two inner layers or circuit path planes located inside the high current circuit board 321 each respectively have a layer thickness of 110 $\mu$m, while the conductor paths in the two outer layers on the outer surface of the high current circuit board 321 each respectively have a layer thickness of 140 $\mu$m, to give a total thickness of the conductor path structure of approximately 500 $\mu$m. The respective conductor paths can be made of copper, for example.

As a next component, the electronic module 3 includes a control unit 33 arranged on a substrate or circuit board 331 in a third circuit plane located at a minimum vertical spacing above the high current circuit board 321 of the connection or junction unit 32. The electronic components of the control unit 33 are, for example, mounted on two sides of a circuit board forming a substrate or carrier 331. For example, this circuit board 331 may be made of an FR4 material and have a surface area of 100 mm×100 mm. For a circuit path structure realized with six circuit path planes, i.e. a six-layered structure of the substrate 331, the substrate 331 has a total thickness of 2 mm, for example.

The above described components are arranged and mounted within the electronic module housing 34. The housing 34 further includes electrical sockets or plug connectors 36 and 37 suitable for use in a motor vehicle electrical system, integrated into the housing 34. For example, one socket or plug connector 37 serves as a d.c. voltage input from the fuel cell, while a second socket or plug connector 36 serves for the connection of signal or control lines leading to electrical systems or components of the motor vehicle. The socket or plug connection 36 can be adapted for connecting a cable to a databus of the motor vehicle, and particularly an ISO standard controlled area network (CAN) bus. The electronic module housing 34 may be formed in two parts, including a housing side wall 341 and a housing cover or lid 342 adapted to be adhesively bonded onto the housing side wall 341.

The electronic module 3 may further include components such as interference shielding or eliminating components such as capacitors and ferrite rings, for avoiding external interference influences such as incident EMC radiation, current ripples in the power supply, overvoltage conditions or the like. Such further protective components are electrically and/or mechanically connected to the high current circuit board 321 of the connection or junction unit 32 or with the electronic module housing 34 itself, in any known manner and configuration.

Figure 3:
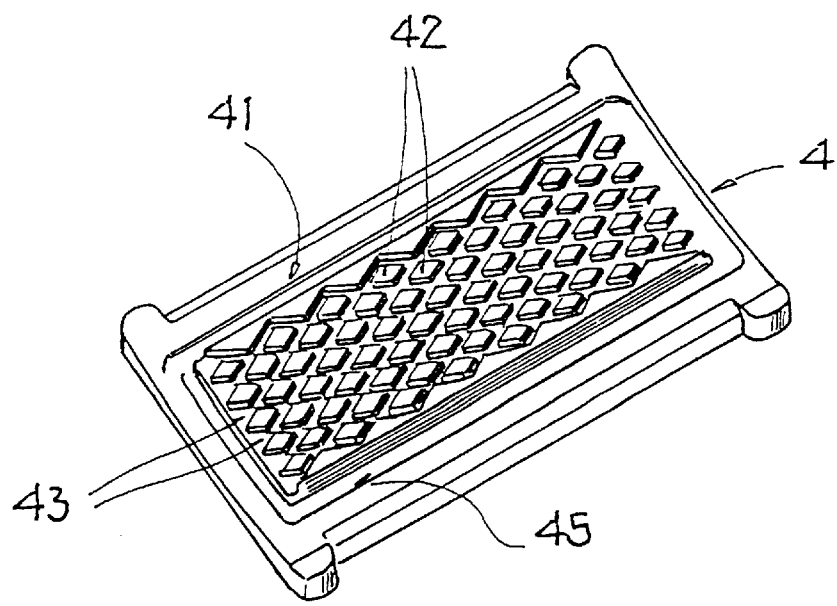
FIG. 3 is a detailed perspective view of a cooling insert of an arrangement according to the invention.

The cooling insert 4 is, for example, an aluminum die-cast part provided with a filler material, and having dimensions of 121 mm×76 mm and a thickness of 10 mm. As shown especially in FIG. 3, the cooling insert 4 generally has a cylindrically curved plate shape matching the cylindrical curvature of the outer wall 22 and inner wall 23 of the motor housing 21. The bottom surface 41 of the cooling insert 4 is preferably provided with geometrical elements or protrusions 42 to increase the total heat transferring surface and to provide flow channels 43 for guiding the flow of cooling water or other cooling medium 44 therebetween. These protrusions 42 may have a diamond shape, rhomboid shape, or other shape. The cooling water 44 is forced to flow through the flow channels 43 between the protrusions 42, which generates a turbulence and a forced convection and thereby achieves a very effective cooling of the cooling insert 4.

Before joining together the electric motor 2 and the electronic module 3, the power unit 31 is directly mounted on the cooling insert 4, and then the cooling insert 4 is inserted into an opening or recess in the electronic module housing 34. This recess is adapted to the size and shape of the cooling insert 4, and particularly includes a clamping rim 38 around the perimeter thereof for retaining the cooling insert 4 and pressing the insert 4 against the motor housing as described below. A separate clamping frame 39 may additionally be arranged to clamp down the insert as shown in FIG. 2.

Then, when assembling the electronic module 3 onto the electric motor 2, the cooling insert 4 protrudes from the electronic module 3 and is inserted in a form-fitting manner into an opening in the outer wall 22 of the motor housing 21. Thus, the electronic module 3 is mounted radially outwardly onto the cylindrical outer wall 22 of the motor housing 21. Preferably the insert 4 is arranged so that the geometric protrusions 42 come flushly into contact with the inner wall 23 of the motor housing 21. In this manner, the cooling insert 4 is integrated into the water jacket 24 of the electric motor 1, and the cooling of the electronic module 3 is directly coupled with the cooling of the electric motor 2. In other words, the cooling of both the electronic module 3 and of the electric motor 2 is provided by a single common cooling water flow 44 through the water jacket 24.

The water-tight seal of the cooling insert 4 relative to the housing 21 or water jacket 24 of the electric motor 2 may be achieved by arranging a properly formed seal element 6 between the two parts. Such a seal element 6 may, for example, be made of a synthetic rubber such as nitrile butadiene rubber (NBR). Preferably, the seal element 6 is received in a corresponding groove 45 provided around the perimeter of the cooling insert 4, as shown especially in FIG. 3. When the electronic module is clamped against the motor housing, the cooling insert 4 is accordingly clamped so as to press the seal element 6 between the cooling insert 4 and the outer wall 22 of the motor 2. Alternatively, the seal element 6 may be arranged directly between the electronic module housing and the motor housing.

To achieve a thermal decoupling of the cooling insert 4 from the inner wall 23 of the electric motor housing 21, a thermal insulation layer 7 is preferably arranged between the inner wall 23 and the bottom surface 41 of the cooling insert 4. For example, the thermal insulation layer 7 may comprise a one-sided adhesive thermal insulation film 7 that is adhesively bonded onto the surfaces of the geometric protrusions 42 on the bottom surface 41 of the cooling insert 4, before the cooling insert 4 is inserted into the opening in the electric motor housing 21. The thermal insulation film 7 is preferably made of a synthetic plastic film having a relatively low thermal conductivity, for example a one-sided adhesive-backed plastic film of a polyester or kapton.

When joining the electric motor 2 and the electronic module 3, the electrical connection between these two components is achieved by internal electrical contacts or connection lines 55 that extend through corresponding aligned openings or holes 40 in the electric motor housing 21 and the electronic module housing 34. These pass-through openings 40 for the electric connection lines may, for example be located on the cylindrical outer surface of the motor housing or in the area of the bearing member or shaft stub 26. For example, phase ends are provided as the electrical connection lines.

The mechanical connection or securing of the electronic module 3 onto the electric motor 2 is achieved by any suitable means. For example, in the present illustrated embodiment, the electronic module housing 34 is screwed or clamped tightly against the motor housing 21 by means of bolts 52 fastening together clamping straps or bails 51. In this manner, a compact integrated electric drive unit 1 can be achieved, whereby the assembly steps are very easy to carry out, and the construction is simple and economical.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An electric drive unit comprising an electric motor and an electronic module that are respectively separable modular components which are connected to each other, wherein:

said electric motor comprises a double-walled motor housing including a circumferential inner wall and a circumferential outer wall with a cooling medium flow passage therebetween as well as two end plates extending radially at opposite ends of said circumferential inner and outer walls, and a rotor and a stator arranged within said motor housing;

said circumferential outer wall of said motor housing has an opening therein that opens into said cooling medium flow passage;

said electronic module comprises a module housing including a module housing wall having a recess therein, a cooling insert received at least partially in said recess and connected to said module housing, and at least one power dissipating electronic functional unit mounted on said cooling insert; and said electronic module is releasably connected to said circumferential outer wall of said motor housing at a location radially outwardly thereon so that said recess of said module housing wall is aligned with said opening in said outer wall of said motor housing and said cooling insert is arranged in said opening and exposed to said cooling medium flow passage.

2. The electric drive unit according to claim 1, wherein said cooling insert protrudes from said recess of said module housing, wall reaches through said opening in said outer wall of said motor housing, and protrudes into said cooling medium flow passage between said inner wall and said outer wall.

3. The electric drive unit according to claim 2, wherein said cooling insert protrudes entirely through said cooling medium flow passage from said outer wall to said inner wall and abuts against said inner wall of said motor housing, and wherein said opening, said recess and said cooling insert each have a corresponding plan shape.

4. The electric drive unit according to claim 1, wherein said cooling insert is a single solid unitary component comprising a cylindrically curved metal plate, said recess of said module housing wall passes through said module housing wall and opens into an interior of said module housing, and said power dissipating electronic functional unit is mounted directly on said cooling insert and protrudes from said cooling insert into said interior of said module housing.

5. The electric drive unit according to claim 1, wherein said cooling insert has a first surface on which said power dissipating electronic functional unit is mounted and a second surface that is opposite said first surface and is exposed to said cooling medium flow passage through said opening, and wherein said cooling insert further comprises geometrically shaped protrusions on said second surface so as to increase a total surface area of said cooling insert that is exposed to said cooling medium flow passage.

6. The electric drive unit according to claim 5, wherein said geometrically shaped protrusions each have a diamond rhombic shape and are spaced apart from each other to form cooling medium flow channels therebetween.

7. The electric drive unit according to claim 1, further comprising a thermal insulating layer arranged between said inner wall of said motor housing and a side of said cooling insert facing said inner wall.

8. The electric drive unit according to claim 7, wherein said thermal insulating layer is applied onto said side of said cooling insert facing said inner wall.

9. The electric drive unit according to claim 8, wherein said thermal insulating layer is a synthetic plastic film being self-adhesive on one side thereof that is applied onto said side of said cooling insert.

10. The electric drive unit according to claim 8, wherein said thermal insulating layer comprises a film of at least one of polyimide, tetrafluoroethylene, fluorinated ethylene propylene, polyester, or kapton.

11. The electric drive unit according to claim 1, further comprising an elastic seal element arranged around a perimeter of said opening and pressed between said outer wall of said motor housing and at least one of said module housing wall and said cooling insert.

12. The electric drive unit according to claim 11, wherein said cooling insert has a maximum plan size greater than a plan size of said opening, and said cooling insert has a groove therein, in which said seal element is received.

13. The electric drive unit according to claim 11, further comprising at least one clamping strap that extends around said motor housing and that tightly holds said module housing against said motor housing.

14. The electric drive unit according to claim 11, wherein said recess of said module housing wall includes a rim that presses said cooling insert against said motor housing when said module housing is pressed against said motor housing.

15. The electric drive unit according to claim 1, wherein said electronic module comprises at least one of an electrical connector socket and an electrical connector plug that is set into a second recess in said module housing wall and that is adapted to be externally connected to at least one of a power supply line and a control signal line.

16. The electric drive unit according to claim 1, further comprising an internal electrical connection line extending between and electrically interconnecting said electric motor and said electronic module, wherein said internal electrical connection line passes through aligned holes provided in said motor housing and said module housing wall.

17. The electric drive unit according to claim 16, not including any external liquid conduit externally interconnecting said electric motor with said electronic module, and not including any external electric conductor externally interconnecting said electric motor with said electronic module.

18. The electric drive unit according to claim 1, wherein said electronic module further comprises a plurality of electronic functional units including said power dissipating functional unit, wherein each said functional unit respectively comprises at least one electronic component arranged on a carrier substrate, and wherein said carrier substrates of said functional units are arranged spaced apart from one another on respective plural circuit planes within said module housing.

19. The electric drive unit according to claim 18, wherein said power dissipating electronic functional unit comprises an electronic power unit arranged on a carrier substrate which is mounted on said cooling insert, a second one of said functional units comprises a connection unit arranged on a high current circuit board as a carrier substrate and provides a power supply conductor, a phase distribution conductor, and electrical contacts within said electronic module, and a third one of said functional units comprises a control unit arranged on a circuit board as a carrier substrate.

20. The electric drive unit according to claim 19, further comprising electrical connectors having mechanical compensation corrugations provided on at least one side of said high current circuit board.

21. The electric drive unit according to claim 1, wherein said electronic module is connected onto said circumferential outer wall directly radially outwardly adjacent said stator.

22. The electric drive unit according to claim 1, wherein said module housing and said insert together completely enclose said electronic module independently from said electric motor.

* * * * *